United States Patent [19]

Krasznai

[11] Patent Number: 5,379,685

[45] Date of Patent: Jan. 10, 1995

[54] VENTING SYSTEM FOR AN ELECTRIC TOASTER

[75] Inventor: Charles Z. Krasznai, Fairfield, Conn.

[73] Assignee: Black & Decker Inc., Newark, Del.

[21] Appl. No.: 178,997

[22] Filed: Jan. 7, 1994

[51] Int. Cl.[6] .......................... H05B 3/06; A47F 5/08; F24C 7/00

[52] U.S. Cl. ......................... 99/389; 99/401; 126/21 R; 126/275 E; 219/531; 219/521; 219/386

[58] Field of Search ................. 99/389, 385, 401, 447; 219/386, 521, 531, 400, 405, 411; 126/275 E, 198, 21 A, 21 R

[56] References Cited

U.S. PATENT DOCUMENTS

| | | |
|---|---|---|
| 2,266,301 | 12/1941 | Biebel . |
| 2,598,592 | 5/1952 | Olson et al. . |
| 3,363,089 | 1/1968 | Snyder . |
| 3,461,274 | 8/1969 | Williams . |
| 3,659,578 | 5/1972 | Davis et al. ........................ 126/21 R |
| 4,180,049 | 12/1979 | Carr et al. ........................ 126/21 R |
| 4,396,825 | 8/1983 | Cox et al. ............................ 219/521 |
| 4,610,238 | 9/1986 | Veth ..................................... 126/198 |
| 4,628,185 | 12/1986 | Norwood et al. .................. 219/386 |
| 4,656,337 | 4/1987 | Lastofka et al. ................... 219/386 |
| 4,659,908 | 4/1987 | Bouillet ............................... 219/386 |
| 4,718,332 | 1/1988 | Mothrath ............................. 99/401 |
| 5,126,534 | 6/1992 | Kwong .................................. 219/386 |
| 5,193,520 | 3/1993 | Gostelow et al. .................. 126/198 |
| 5,204,503 | 4/1993 | Maiellano et al. ................. 219/400 |
| 5,237,913 | 8/1993 | Hahnewald et al. ................ 99/389 |

*Primary Examiner*—Timothy F. Simone
*Assistant Examiner*—Reginald L. Alexander
*Attorney, Agent, or Firm*—Barry E. Deutsch

[57] ABSTRACT

An electric toaster is suspended from the lower surface of a kitchen cabinet. The electric toaster has a horizontally disposed toasting compartment. An inner wall defines the toasting compartment and is spaced from an outer housing wall. A partition extends in the space between the inner and outer housing walls to separate the space into inner and outer air paths. An air inlet is in fluid flow communication with the inner air path to obtain convective cooling of the inner air path. The air in the outer air path provides an insulating barrier to minimize the transfer of heat from the toasting compartment to the housing wall.

8 Claims, 2 Drawing Sheets

VENTING SYSTEM FOR AN ELECTRIC TOASTER

BACKGROUND OF THE INVENTION

This invention relates to an electric toaster suspended from the bottom of a kitchen cabinet to save counter space, and in particular to a venting system for such toaster.

As shown in U.S. Pat. No. 4,628,185, assigned to the same assignee as the assignee of the present invention, it is known to suspend electric toasters directly under the kitchen cabinetry to provide additional counter space. When the toaster is supported underneath a wood cabinet, it is important that the cabinet be protected from heat generated by the toaster.

As exemplified in U.S. Pat. No. 4,628,185, the prior art has utilized hoods and associated mounting arrangements for suspending a toaster under a wooden kitchen cabinet. The hoods sometimes do not adequately protect the kitchen cabinets from the heat developed by the toaster. Furthermore, hoods and the like are generally not aesthetically pleasing and degrade the general appearance of the toaster.

The present invention is concerned with toasters that are suspended beneath the lower surface of a kitchen cabinet and more particularly to a venting arrangement for the toaster which eliminates the need for a separate hood while adequately protecting the cabinet from heat generated by the toaster.

SUMMARY OF THE INVENTION

The foregoing object and other objects of the present invention are attained in an electric toaster including heating means for toasting a food product inserted into a toasting compartment. The toaster is suspended under the lower surface of a kitchen cabinet. The toaster includes an outer housing enclosing the toasting compartment including a vertically extending wall and a horizontally extending wall disposed substantially parallel to the lower surface of the kitchen cabinet. Inner wall means is spaced from the walls of the outer housing and includes a first leg spaced from and extending parallel to the outer housing vertical wall and a second leg spaced from and extending parallel to the outer housing horizontal wall. Partition means extend between the horizontal and vertical walls of the outer housing and the first and second legs of the inner wall means to define inner and outer air paths. Each of the air paths includes a first vertically extending section and a second horizontally extending section in fluid flow communication with the first section. Air inlet means is positioned substantially at the lower end of the inner air path to enable relatively cool ambient air to enter into the air flow path. Air outlet means is positioned substantially at the end of the horizontal section of each air path remote from the vertical section. The inner walls, the air flowing within the inner air path, and the air contained in the outer air path minimize the transfer of heat from the toasting compartment to the walls of the outer housing.

The invention further relates to a method of venting a toaster suspended under the lower surface of a kitchen cabinet comprising the steps of providing an inner air path between the walls defining the toaster toasting compartment and the toaster outer housing wall and an outer air path sandwiched between the inner air path and the outer housing wall; forming an air inlet to permit ambient air to enter into the lower end of the inner and outer air paths; and forming an air outlet at the end of the inner and outer air paths to permit the ambient air to exit from the air paths.

DESCRIPTION OF THE PREFERRED EMBODIMENT

Figure 1:
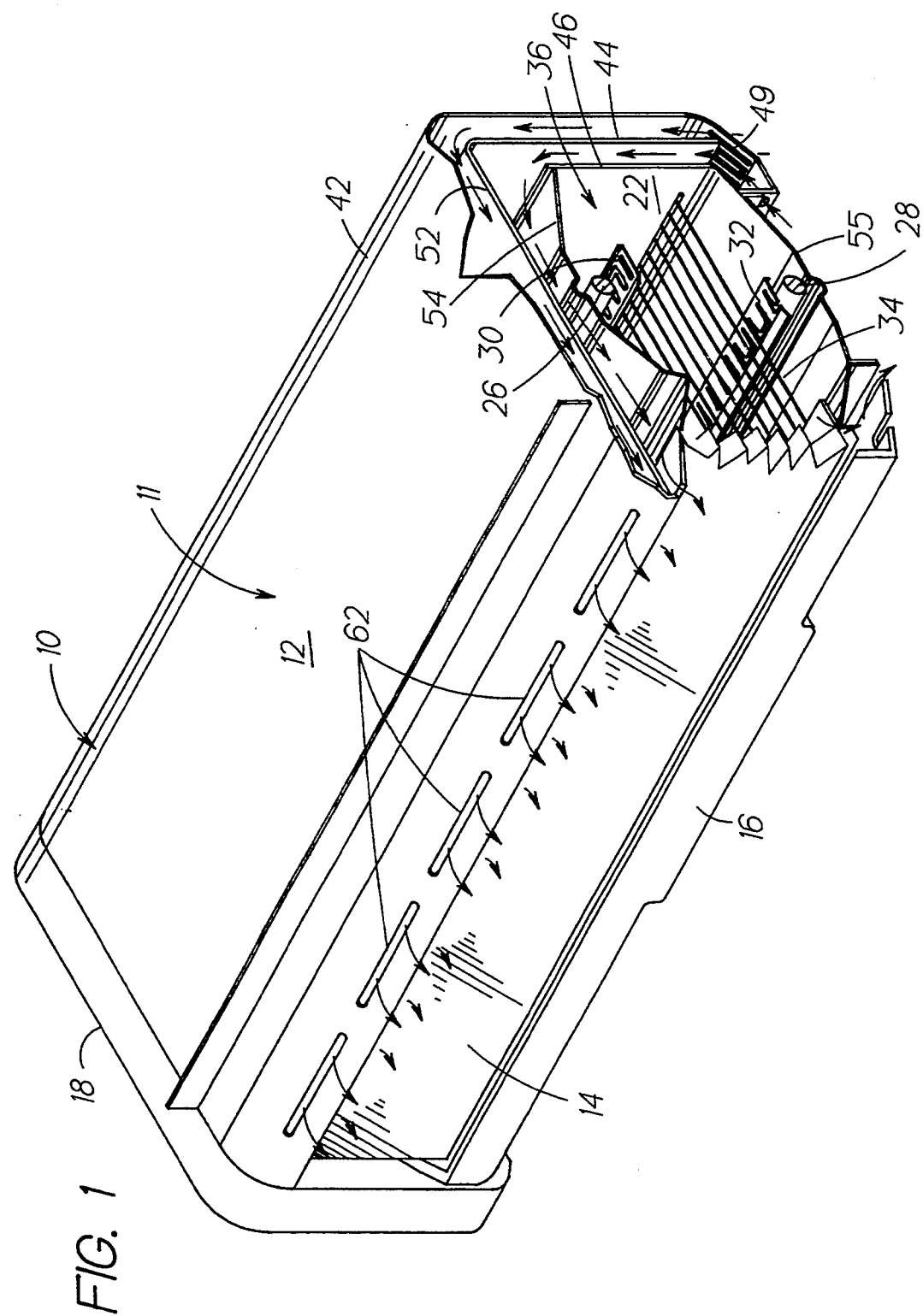
FIG. 1 is a perspective view, taken from the front of a toaster embodying the present invention, with a portion of the toaster being broken away for illustrative purposes.

Referring now to the figures of the drawing, there shall be described a preferred embodiment of the present invention. Referring to the figures, like numerals shall refer to like parts.

Figure 2:
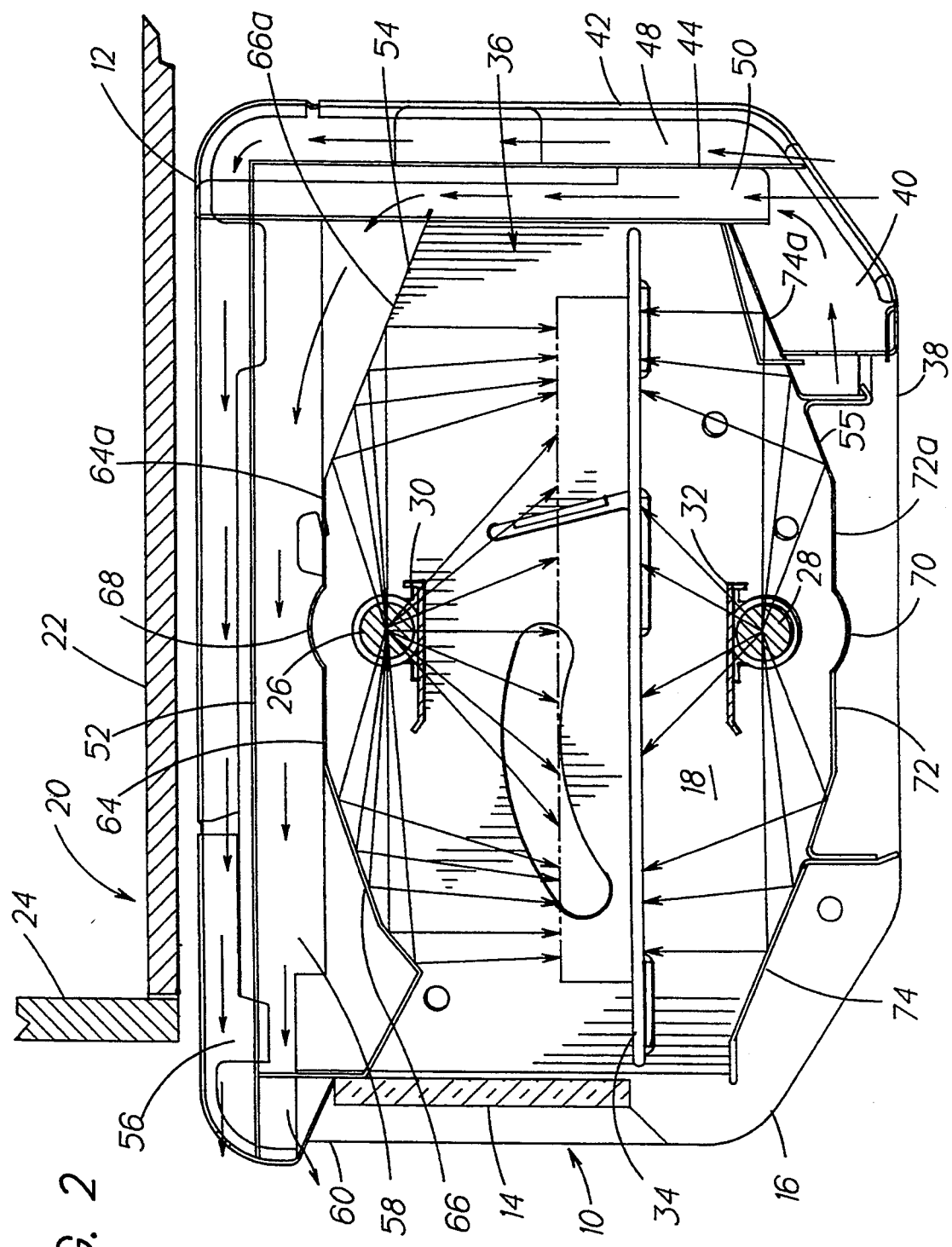
FIG. 2 is a sectional end view of the toaster illustrated in FIG. 1.

The present invention is embodied in an electric toaster 10 which as shown in FIG. 2 is designed to be suspended under the bottom surface of kitchen cabinet 20. Cabinet 20 includes a front wall 24 and a bottom wall 22. A suitable support system for suspending toaster 10 from kitchen cabinet 20 is described and illustrated in co-pending U.S. application filed Jan. 7, 1994, Ser. No. 08/178,973, in the names of Richard B. Kosten and Charles Z. Krasznai and assigned to the same assignee as the assignee hereof.

Toaster 10 includes a top wall 12, a rear wall 42, a bottom wall 38, side walls 18 (only one of which is shown) and a front wall or door 14. In the preferred embodiment, front wall 14 is made from glass or other translucent or transparent material and is mounted on pivotable support frame 16. Frame 16 pivots about pivot pin 36. Glass front wall or door 14 pivots downwardly with respect to the suspended toaster to provide access to the interior thereof for either loading or unloading the toasting chamber.

Toaster 10 further includes a pair of vertically spaced electrical heaters, 26, 28. Heaters 26 and 28 are disposed respectively above and below a toasting rack 34 mounted in toasting chamber 64. Heater 26 has a shield 30 disposed below the lower surface thereof while heater 28 has a shield 32 disposed above the top surface thereof. For a more detailed description of the toasting chamber 64 and shields 30 and 32 reference may be had to co-pending application filed Jan. 7, 1994, Ser. No. 08/178,998, in the names of Charles Z. Krasznai and Richard B. Kosten and assigned to the same assignee as the assignee hereof. Reference may also be had to a further co-pending application filed Jan. 7, 1994, Ser. No. 08/179,026, in the name of Charles Z. Krasznai, Richard B. Kosten and Robert St. John and assigned to the same assignee as the assignee hereof for a more detailed description of a preferred control for opening door 14 at the completion of the toasting cycle and for retaining the door in a closed position during the toasting cycle.

Toasting chamber 64 is defined by door 14, upper wall 54, lower wall 55, back wall 46, and side walls 18. Walls 54 and 55 extend in a horizontal plane while wall 46 extends in a vertical plane. Walls 54, 55 and 46 are spaced from the respective top, bottom, and rear walls 12, 38 and 42 which partially form the toaster housing 11. A partition wall 44 extends vertically in the space between outer wall 42 of housing 11 and wall 46 defining the rear of toasting compartment 64. Partition wall 44 divides the space into an inner air path 50 and an outer air path 48. Inner air path 50 communicates with air plenum 40. Plenum 40 in turn is in fluid flow communication with air inlet openings 49 formed in bottom wall 38. While most of the air passing through inlet openings 49 enters plenum 40, a very small section of the openings extends beyond partition wall 44 to enable a small quantity of ambient air to enter into outer air path 48.

Partition wall 44 extends vertically upward and connects with a horizontally extending wall 52. Inner air flow path 50 extends upwardly and is in fluid flow communication with a horizontally extending air flow path 58. Air flow path 48 extends upwardly and is in fluid flow communication with horizontally extending air flow path 56. Partition wall 52 separates the horizontally extending flow paths into inner flow path 58 and outer flow path 56. Inner flow path 58 terminates in outlet air vent 60 provided at the front of the toaster 10 while outer flow path 56 terminates in outlet vents 62 which are also provided at the front of toaster 10.

With reference to FIG. 2 it should be noted that the outlet vents 60 and 62 are positioned forwardly at least one and one half inches of a vertical line tangent to the front face 24 of cabinet 20. Also as shown in FIG. 2 there is at least a one quarter inch air gap between upper wall 12 of toaster 10 and the lower wall 22 of cabinet 20.

In operation, a comestible is placed on rack 34 and heaters 26 and 28 are connected to the source of power when the rack is properly positioned within toasting chamber 64. During the toasting cycle, the temperature within the toasting chamber 64 increases quite rapidly and to a relatively high level, e.g. 280°-300° F. Unless properly vented, the heat developed within chamber 64 may be transmitted to the wall of the kitchen and to the walls 22 and 24 of kitchen cabinet 20 and cause damage thereto. To prevent the suspended toaster 10 from causing heat damage, relatively cool ambient air is supplied to inner air path 50 via inlet openings 49 and plenum chamber 40. The relatively cool ambient air moves upwardly as it is heated and convectively cools wall 46 defining the rear of chamber 64. The ambient air from path 50 also flows through path 58 to convectively cool upper wall 54 of chamber 64. The relatively warm air after it has passed in heat transfer relation with walls 46 and 54 is discharged via vents 60 at the front of toaster 10. It should be noted that vents 60 point downwardly so that the air discharged from air path 58 is not directed towards cabinet 20.

While most of the air passing through openings 49 is directed into inner air path 50, a very small portion of such air is directed into outer air path 48. The air in air path 48 is basically quiescent and establishes an air insulating barrier between partition wall 44 and outer wall 42. While substantially quiescent there is a certain amount of air flow from air path 48 into air path 56 in fluid flow communication therewith. Like the air in path 48, the air in path 56 is substantially motionless and establishes an insulating barrier between partition wall 52 and upper wall 12 of toaster 10. A small quantity of air is continuously discharged from air path 56 via outlet openings 62 provided at the front of toaster 10. It should be noted that the area of outlet openings 60 is substantially greater than the area of outlet openings 62.

The combination of the convective cooling air provided through air path 50 and 58 and the insulating air barriers provided in air paths 48 and 56 and in further combination with the partition walls 44 and 52 minimize the transfer of heat from chamber 64 to outer walls 42 and 12 of housing 11. The foregoing in turn prevents heat damage to bottom surface 22 of kitchen cabinet 20 and to the adjacent wall (not shown) of the kitchen.

While a preferred embodiment of the present invention has been described and illustrated, the invention should not be limited thereto but may be otherwise embodied within the scope of the following claims:

What is claimed is:

1. An electric toaster suspended from a lower surface of a kitchen cabinet and including heating means for toasting a food product inserted into a toasting compartment comprising:

an outer housing enclosing said toasting compartment including a vertically extending wall and a horizontally extending wall disposed substantially parallel to the lower surface of the kitchen cabinet;

inner wall means spaced from the walls of the outer housing having a first leg spaced from and extending parallel to the outer housing vertical wall and a second leg spaced from and extending parallel to the outer housing horizontal wall;

partition means extending between the horizontal and vertical walls of the outer housing and the first and second legs of the inner wall means to define inner and outer air paths;

each of the air paths including a first vertically extending section and a second horizontally extending section in fluid flow communication with the first section; air inlet means positioned substantially at a lower end of the vertically extending section of the inner air path to enable relatively cool ambient air to enter into the inner air path, a relatively small portion of said air inlet means being in fluid flow communication with the vertically extending section of said outer air path to enable a limited quantity of air to flow into said outer air path; and first air outlet means positioned substantially at the end of the horizontal section of the inner air path from the vertical section, second air outlet means positioned substantially at the end of the horizontal section of the outer air path, said second air outlet means restricting the flow of air from said outer air path to form a substantially quiescent air insulating barrier in said outer air flow path, said inner wall means, said inner and outer air paths and said partition means minimizing the transfer of heat from the toasting compartment to the walls of the outer housing.

2. An electric toaster in accordance with claim 1 wherein a top surface of the horizontal wall of the outer housing is located at least one quarter of an inch below the lower surface of the kitchen cabinet.

3. An electric toaster in accordance with claim 2 wherein the air outlet means from said horizontal section is located at least one and one half inches forward of a vertical line representing the front surface of the kitchen cabinet.

4. An electric toaster in accordance with claim 1 wherein the air outlet means from said horizontal section is located at least one and one half inches forward of a vertical line representing the front surface of the kitchen cabinet.

5. An electric toaster suspended from a lower surface of a kitchen cabinet and including heating means for toasting a comestible inserted into a toasting compartment:

an outer housing enclosing said toasting compartment including a vertically extending wall and a horizontally extending wall disposed substantially parallel to the lower surface of the kitchen cabinet;

an inner wall defining the toasting compartment and having a first vertical leg extending parallel to the vertical housing wall and a second horizontal leg extending parallel to the horizontal housing wall;

partition wall means positioned between the horizontal and vertical walls of the outer housing and the first and second legs of the inner wall to define an inner air path and an outer air path;

air inlet means in fluid flow communicating with the inner air path to establish a flow of air moving upwardly in the inner air path for convective cooling thereof a relatively small portion of said air inlet means being in fluid flow communication with said outer air path to enable a limited quantity of air to flow into said outer air path;

first air outlet means positioned substantially at the end of said horizontal leg of the inner air path; and second air outlet means positioned substantially at the end of said horizontal leg of the outer air path for restricting the flow of air from said outer air path for forming a substantially quiescent air insulating barrier in said outer air path to retard the transmission of heat from the toasting compartment to the outer housing.

6. An electric toaster in accordance with claim 5 wherein a top surface of the horizontal wall of the outer housing is located at least one quarter of an inch below the lower surface of the kitchen cabinet.

7. An electric toaster in accordance with claim 6 wherein the air outlet means from said horizontal section is located at least one and one half inches forward of a vertical line representing the front surface of the kitchen cabinet.

8. An electric toaster in accordance with claim 5 wherein the air outlet means from said horizontal section is located at least one and one half inches forward of a vertical line representing the front surface of the kitchen cabinet.

* * * * *